(12) United States Patent
Uchida

(10) Patent No.: US 12,308,260 B2
(45) Date of Patent: May 20, 2025

(54) SEMICONDUCTOR DEVICE MANUFACTURING METHOD AND MOLDING PRESS MACHINE

(71) Applicant: Mitsubishi Electric Corporation, Tokyo (JP)

(72) Inventor: Kiyohiro Uchida, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 54 days.

(21) Appl. No.: 18/167,717

(22) Filed: Feb. 10, 2023

(65) Prior Publication Data

US 2023/0343611 A1 Oct. 26, 2023

(30) Foreign Application Priority Data

Apr. 22, 2022 (JP) ................................. 2022-070453

(51) Int. Cl.
| | | |
|---|---|---|
| H01L 21/00 | (2006.01) | |
| H01L 21/67 | (2006.01) | |
| H01L 23/00 | (2006.01) | |
| H01L 23/367 | (2006.01) | |

(52) U.S. Cl.
CPC .. *H01L 21/67092* (2013.01); *H01L 21/67121* (2013.01); *H01L 23/367* (2013.01); *H01L 24/75* (2013.01); *H01L 24/83* (2013.01); *H01L 2224/753* (2013.01); *H01L 2224/83101* (2013.01); *H01L 2224/8384* (2013.01)

(58) Field of Classification Search
CPC ... H01L 24/75; H01L 21/67121; H01L 21/50; B23K 1/0016; B23K 3/08; B23K 3/087
See application file for complete search history.

(56) References Cited

U.S. PATENT DOCUMENTS

| | | | | |
|---|---|---|---|---|
| 7,445,543 | B2 * | 11/2008 | Torii | B24B 37/345 451/388 |
| 8,544,167 | B2 * | 10/2013 | Morita | H01L 23/49822 29/841 |
| 9,202,800 | B2 * | 12/2015 | Hong | H01L 24/75 |
| 9,688,060 | B2 * | 6/2017 | Bayerer | H01L 25/072 |

(Continued)

FOREIGN PATENT DOCUMENTS

| | | |
|---|---|---|
| JP | S63-174799 A | 7/1988 |
| JP | 2003-068771 A | 3/2003 |

(Continued)

OTHER PUBLICATIONS

"Notice of Reasons for Refusal" Office Action issued in JP 2022-070453; mailed by the Japanese Patent Office on Jan. 28, 2025.

*Primary Examiner* — Erin B Saad
(74) *Attorney, Agent, or Firm* — Studebaker Brackett PLLC

(57) ABSTRACT

A structural body is partially surrounded by a positioning plate, and a semiconductor element, a joining member, and a base plate around the joining member are exposed from the positioning plate, so that a positional relationship between the semiconductor element and the base plate is maintained. The joining member is heated by a heater while the semiconductor element, joining member, and base plate exposed from the positioning plate are isotropically pressurized by a piston via a medium and a bag member.

8 Claims, 8 Drawing Sheets

(56) References Cited

U.S. PATENT DOCUMENTS

| | | | |
|---|---|---|---|
| 2003/0016510 A1* | 1/2003 | Knapp | H01L 24/33 |
| | | | 257/E21.511 |
| 2008/0153258 A1* | 6/2008 | Thallner | H01L 21/67092 |
| | | | 438/455 |
| 2008/0283579 A1 | 11/2008 | Gunturi et al. | |
| 2009/0032570 A1* | 2/2009 | Matsumura | H01L 21/6835 |
| | | | 228/123.1 |
| 2013/0137215 A1 | 5/2013 | Ciliox et al. | |
| 2013/0203218 A1* | 8/2013 | Bayerer | B32B 37/10 |
| | | | 156/382 |

FOREIGN PATENT DOCUMENTS

| | | |
|---|---|---|
| JP | 2009-514240 A | 4/2009 |
| JP | 2021-197447 A | 12/2021 |

* cited by examiner

FIG. 2
STEP(1)
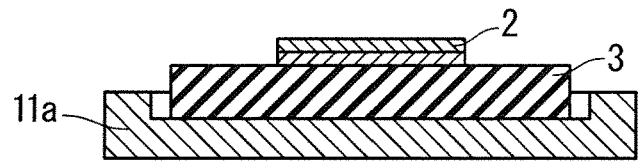
STEP(2)
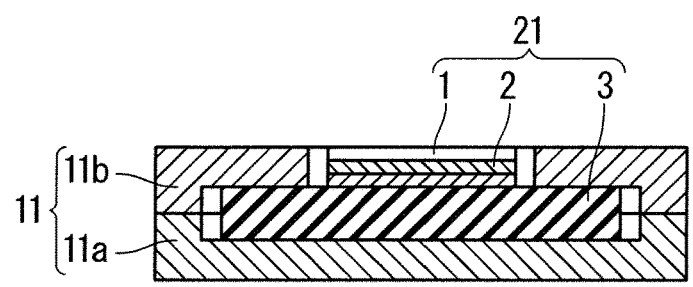
STEP(3)
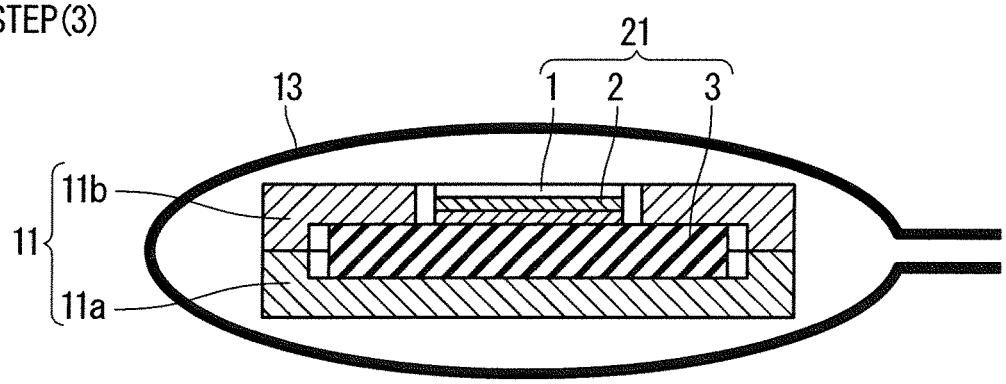
STEP(4)
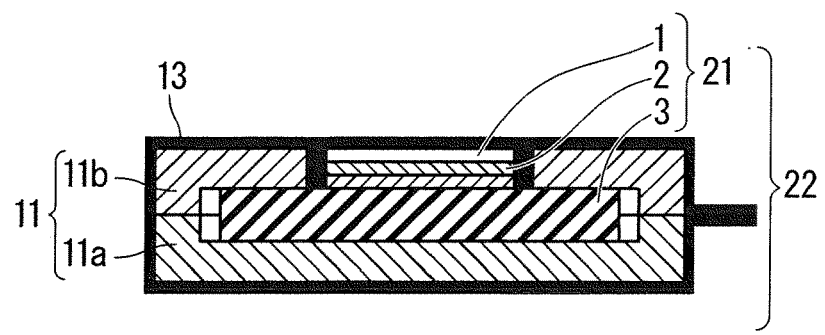

FIG. 5
STEP(3)
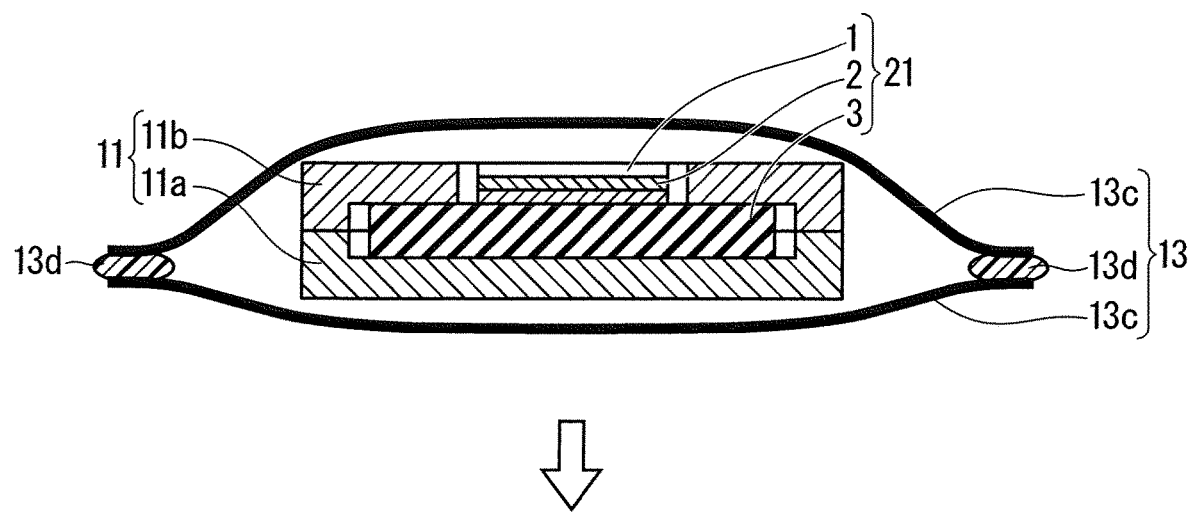
STEP(4)
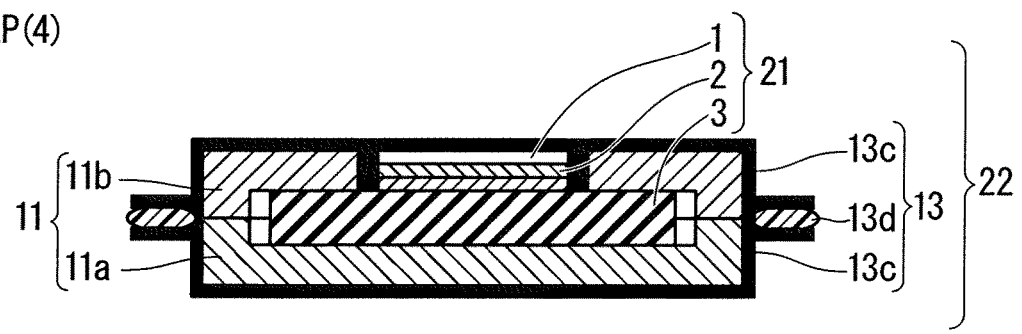

SEMICONDUCTOR DEVICE MANUFACTURING METHOD AND MOLDING PRESS MACHINE

BACKGROUND OF THE INVENTION

Field of the Invention

The present disclosure relates to a semiconductor device manufacturing method and a molding press machine.

Description of the Background Art

A technique for mounting an electronic component to a circuit board by a joining member sintered by pressurization has been proposed. For example, Japanese Patent Application Laid-Open No. 2003-68771 proposes a technique for introducing a member to be joined and a joining member into a plastic cover, exhausting air from the cover and sealing the cover, and then heating the joining member to a sintering temperature while pressurizing the joining member in a chamber.

However, in the process of exhausting air from the cover, the process of pressurizing the joining member in the chamber, and the like, a positional deviation is likely to occur between an insulating substrate and a semiconductor element each of which is a member to be joined; therefore, there has been a problem that the quality of a semiconductor device is impaired.

SUMMARY

The present disclosure has been made in view of the problem described above, and an object of the present disclosure is to provide a technique capable of suppressing a positional deviation between a base plate, such as an insulating substrate, and a semiconductor element.

A semiconductor device manufacturing method according to the present disclosure includes: partially surrounding, with a positioning plate, a structural body in which a joining member containing metal powder is provided between a semiconductor element and a base plate, and exposing the semiconductor element, the joining member, and the base plate around the joining member from the positioning plate to maintain a positional relationship between the semiconductor element and the base plate; placing the structural body and the positioning plate in a bag member with the positional relationship maintained; sealing the bag member with an inside of the bag member depressurized to form a semi-finished product; housing, in a chamber, the semi-finished product and a medium surrounding the semi-finished product; and heating the joining member with a heater while isotropically pressurizing the semiconductor element, joining member, and base plate exposed from the positioning plate, with a piston via the medium and the bag member.

This configuration is capable of suppressing a positional deviation between the base plate and the semiconductor element.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 2 is a sectional view illustrating a process of manufacturing the semiconductor device according to the first preferred embodiment.

FIG. 5 is a sectional view illustrating a process of manufacturing a semiconductor device according to a third preferred embodiment.

DESCRIPTION OF THE PREFERRED EMBODIMENTS

Figure 1:
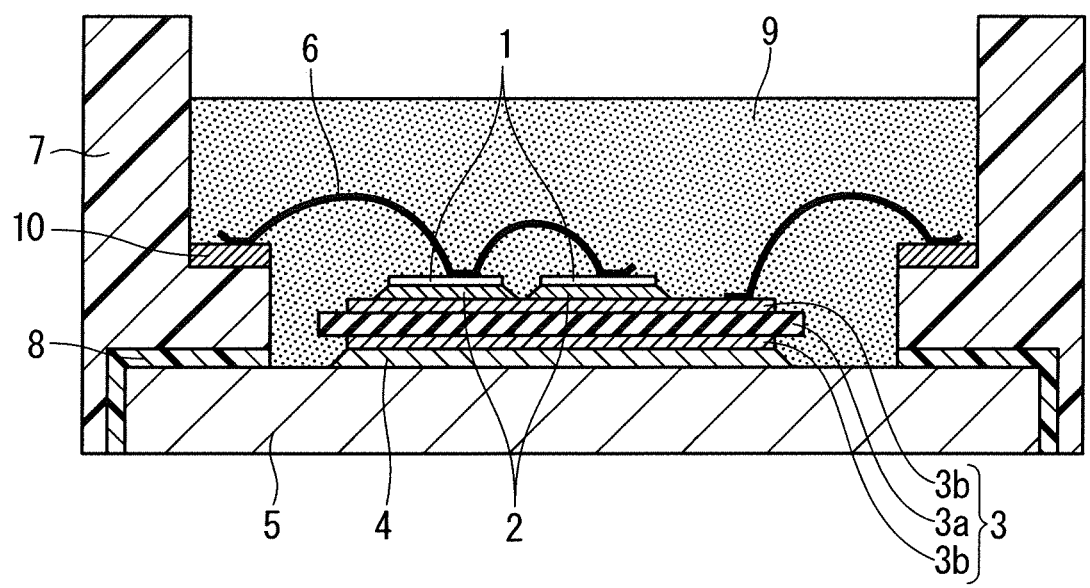
FIG. 1 is a sectional view illustrating a configuration of a semiconductor device according to a first preferred embodiment.

Hereinafter, preferred embodiments will be described with reference to the accompanying drawings. Features to be described in each of the following preferred embodiments are merely illustrative, and all the features are not necessarily essential. In the following description, similar constituent elements in a plurality of preferred embodiments are denoted by the same or similar reference numerals, and different constituent elements will be mainly described. Also in the following description, specific positions and directions such as "upper", "lower", "left", "right", "front", and "back" do not necessarily coincide with positions and directions in actual implementation.

First Preferred Embodiment

FIG. 1 is a sectional view illustrating a configuration of a semiconductor device according to a first preferred embodiment. The semiconductor device illustrated in FIG. 1 is, for example, a power semiconductor device.

The semiconductor device illustrated in FIG. 1 includes a semiconductor element 1, joining members 2 and 4, an insulating substrate 3 which is a base plate, a heat dissipating plate 5, a metal wire 6, a casing 7, an adhesive 8, a sealing member 9, and an electrode 10.

The insulating substrate 3 includes an insulating portion 3a which is an insulating layer, and circuit pattern portions 3b. A material for the insulating portion 3a is, for example, an inorganic ceramic material such as aluminum oxide ($Al_2O_3$), aluminum nitride (AlN), or silicon nitride ($Si_3N_4$).

The circuit pattern portions 3b are respectively provided on both surfaces of the insulating portion 3a. A material for the circuit pattern portions 3b is, for example, copper, aluminum, an alloy thereof, or the like, and is preferably a material with high electrical conductivity and high thermal conductivity.

The semiconductor element 1 is mounted on the insulating substrate 3 with the joining member 2 interposed between the semiconductor element 1 and the insulating substrate 3. The semiconductor element 1 is, for example, a power semiconductor element such as a metal oxide semiconductor field effect transistor (MOSFET), an insulated gate bipolar transistor (IGBT), a reverse conducting-IGBT (RC-IGBT), a Schottky barrier diode (SBD), or a PN junction diode (PND). A material for the semiconductor element 1 may be typical silicon (Si) or may be a wide band gap semiconductor such as silicon carbide (SiC), gallium nitride (GaN), or diamond. In a case where the material for the semiconductor element 1 is a wide band gap semiconductor, the semiconductor element 1 enables stable operation under high temperature and high voltage, and high-speed switching.

The semiconductor device includes at least one semiconductor element 1. For example, a configuration including an IGBT and a diode connected in antiparallel with the IGBT is defined as one unit. A one-element configuration including one unit, a two-element configuration including two units, a six-element configuration including six units, or the like is applied to a circuit configuration of the semiconductor device. It is determined which one of the configurations is applied to the circuit configuration of the semiconductor device, depending on specifications of the semiconductor device.

The joining member 2 joins the semiconductor element 1 and the upper circuit pattern portion 3b of the insulating substrate 3 together. The joining member 2 is, for example, a metal joining member such as a sintered material formed of metal powder such as nano-silver and nano-copper particles.

The insulating substrate 3 is mounted on the heat dissipating plate 5 with the joining member 4 interposed between the insulating substrate 3 and the heat dissipating plate 5. A material for the heat dissipating plate 5 may include, for example, a metal material such as copper, aluminum, or a copper-molybdenum alloy (CuMo), or may include, for example, a composite material such as a silicon carbide-aluminum composite (AlSiC) or a silicon carbide-magnesium composite (MgSiC). Alternatively, the material for the heat dissipating plate 5 may include, for example, an organic material such as an epoxy resin, a polyimide resin, an acrylic resin, or a polyphenylene sulfide (PPS) resin.

The joining member 4 joins the heat dissipating plate 5 and the lower circuit pattern portion 3b of the insulating substrate 3 together. A material for the joining member 4 is, for example, solder made of lead (PB), tin (Sn), or the like, or a solder alloy.

The casing 7 surrounds lateral sides of the semiconductor element 1, insulating substrate 3, and heat dissipating plate 5. A material for the casing 7 may be any material having electrical insulation properties and is, for example, a polyphenylene sulfide (PPS) resin, a polybutylene terephthalate (PBT) resin, a polyethylene terephthalate-polybutylene terephthalate (PET-PBT) resin, or the like.

The adhesive 8 bonds a peripheral edge portion of the heat dissipating plate 5 and a lower portion of the casing 7 together. A silicone-based adhesive is generally used as the adhesive 8. A material for the adhesive 8 may be, for example, an acrylic resin, an epoxy resin, or the like.

The electrode 10 is provided integrally with the casing 7. One end of the electrode 10 is provided near the semiconductor element 1 with respect to the casing 7, and the other end of the electrode 10 is provided opposite to the semiconductor element 1 with respect to the casing 7. A material for the electrode 10 is, for example, metal mainly including copper (Cu), an alloy thereof, or the like. A plating layer of nickel (Ni) or the like is preferably provided on a surface of the electrode 10; however, the plating layer is not necessarily provided.

The metal wire 6 selectively connects the semiconductor element 1, the upper circuit pattern portion 3b, and the electrode 10. The metal wire 6 is, for example, a metal line made of aluminum (Al), copper (Cu), an alloy thereof, or the like.

The sealing member 9 is provided in a space in the casing 7, and seals an aggregate of the components described above, as a body to be sealed. A material for the sealing member 9 is, for example, an insulating resin such a silicone gel or an epoxy resin. Although not illustrated, a control board connected by wiring to the semiconductor element 1 may be provided in the sealing member 9.

<Manufacturing Method>

FIG. 2 is a sectional view illustrating a process of manufacturing the semiconductor device according to the first preferred embodiment. Specifically, FIG. 2 is a sectional view illustrating a process of forming a semi-finished product which is a pressurization-target product.

In step (1), a joining member containing an organic solvent and metal powder such as silver or copper is applied to an upper surface of an insulating substrate 3 by a dispensing method or a print masking method. The joining member is heated to about 100° C. to 150° C. The organic solvent is thus volatilized and removed, so that a joining member 2 containing the metal powder is formed. It should be noted that the organic solvent may remain in the joining member 2 in a minute amount.

Next, a lower portion of the insulating substrate 3 is fitted into a recess of a first positioning plate 11a. The recess of the first positioning plate 11a is slightly larger than an outer shape of the insulating substrate 3.

In step (2), next, a second positioning plate 11b having a recess slightly larger than the outer shape of the insulating substrate 3 and a through hole slightly larger than an outer shape of a semiconductor element 1 is attached to the configuration obtained in step (1). For example, after the semiconductor element 1 is mounted on the joining member 2, the semiconductor element 1 and the joining member 2 may be fitted into the through hole of the second positioning plate 11b, and an upper portion of the insulating substrate 3 may be fitted into the recess of the second positioning plate 11b. Alternatively, for example, after the joining member 2 is placed on the through hole side of the second positioning plate 11b and the upper portion of the insulating substrate 3 is fitted into the recess of the second positioning plate 11b, the semiconductor element 1 may be fitted into the through hole and mounted on the joining member 2.

The first positioning plate 11a and the second positioning plate 11b described above are capable of maintaining a positional relationship between the semiconductor element 1 and the insulating substrate 3, that is, is capable of suppressing a change in relative position between the semiconductor element 1 and the insulating substrate 3. Hereinafter, the assembled structure of the first positioning plate 11a and the second positioning plate 11b may be referred to as a positioning plate 11.

As described above, in step (2), a structural body 21 in which the joining member 2 is provided between the semiconductor element 1 and the insulating substrate 3 is partially surrounded by the positioning plate 11, and the semiconductor element 1, the joining member 2, and the insulating substrate 3 around the joining member 2 are exposed from the positioning plate 11. The positional relationship between the semiconductor element 1 and the insulating substrate 3 is thus maintained. A material for the positioning plate 11 may include at least any one of metal, resin, and carbon. This configuration is capable of enhancing heat resistance and mechanical strength of the positioning plate 11, achieving repetitive use of the positioning plate 11, and reducing a cost for manufacturing the semiconductor device.

In step (3), next, the structural body 21 and the positioning plate 11 are placed in a bag member 13 with the positional relationship between the semiconductor element 1 and the insulating substrate 3 maintained. In the first preferred embodiment, the bag member 13 is a single resin bag. A material for the resin bag is, for example, polytetrafluoroethylene (PTFE) with heat resistance of 200° C. or more and ductility, or the like.

In step (4), next, the bag member 13 is sealed with an inside of the bag member 13 degassed and depressurized, so that a semi-finished product 22 is formed. The semi-finished product 22 according to the first preferred embodiment includes the structural body 21, the positioning plate 11, and the bag member 13 with which the structural body 21 and the positioning plate 11 are hermetically covered with.

Figure 3:
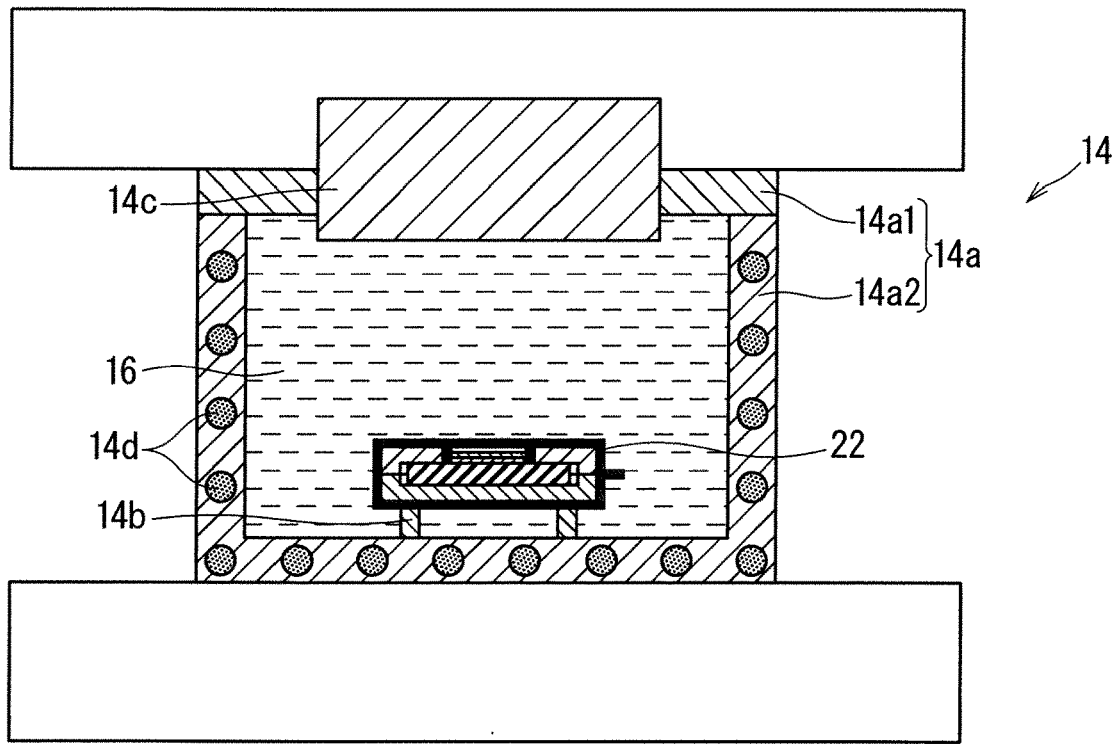
FIG. 3 is a sectional view illustrating a configuration of a molding press machine to be used in the process of manufacturing the semiconductor device according to the first preferred embodiment.

FIG. 3 is a sectional view illustrating a configuration of a molding press machine 14 to be used in the process of manufacturing the semiconductor device according to the first preferred embodiment. The molding press machine 14 pressurizes the semi-finished product 22 formed in step (4) illustrated in FIG. 2, as a pressurization-target product. The molding press machine 14 includes a chamber 14a, a support base 14b, a piston 14c, and a heater 14d.

The chamber 14a includes dies 14a1 and 14a2, and has a space for housing the semi-finished product 22 and a medium 16. The medium 16 is, for example, silicone oil, fluorine-based active liquid, or the like usable at 250° C. to 300° C.

The support base 14b is provided in the space in the chamber 14a, and the semi-finished product 22 is mounted on the support base 14b with the semi-finished product 22 surrounded by the medium 16. Since the semi-finished product 22 is hermetically covered with the bag member 13, entry of the medium 16 into the bag member 13 is suppressed although the semi-finished product 22 is surrounded by the medium 16.

The piston 14c is movable up and down relative to the chamber 14a with the medium 16 in the chamber 14a hermetically covered. As described above, in the semi-finished product 22, the semiconductor element 1, joining member 2, and insulating substrate 3 are covered with the bag member 13 while being exposed from the positioning plate 11 through the through hole of the positioning plate 11. Therefore, when the piston 14c pressurizes the medium 16, the medium 16 isotropically pressurizes the semiconductor element 1, joining member 2, and insulating substrate 3 exposed from the positioning plate 11, via the bag member 13.

That is, the piston 14c isotropically pressurizes the semiconductor element 1, joining member 2, and insulating substrate 3 exposed from the positioning plate 11, via the medium 16 and the bag member 13. A magnitude of the isotropic pressure falls within a range from 20 Pa or more to 50 MPa or less, for example. As described above, the isotropic pressurization of the joining member 2 and its surroundings enables a reduction in diameter of a gap (i.e., a void) generated in the joining member 2. Further, the isotropic pressure is applied to the joining member 2 on a projection plane of the semiconductor element 1. This configuration is therefore capable of suppressing nonuniformity of coarse density between a region near a terminal end and a region near a center of the joining member 2. This configuration is effective in a case where an area of the semiconductor element 1 is large.

The heater 14d is provided in the chamber 14a. The heater 14d heats the joining member 2 by heating the inside of the chamber 14a at a temperature in a range from 250° C. or more to 300° C. or less, for example, during the isotropic pressurization by the piston 14c.

In the molding press machine 14 configured as described above, the semi-finished product 22 and the medium 16 surrounding the semi-finished product 22 are housed in the chamber 14a. Thereafter, the heater 14d heats the joining member 2 while the piston 14c isotropically pressurizes the insulating substrate 3, joining member 2, and semiconductor element 1 exposed from the positioning plate 11, via the medium 16 and the bag member 13. This operation of the molding press machine 14 is capable of sintering the joining member 2 having voids reduced in diameter and having uniform coarse density, and is therefore capable of joining by sintering the semiconductor element 1 and the insulating substrate 3 together, with high quality at low cost.

After completion of the joining, the semi-finished product 22 is taken out of the chamber 14a, the sealing of the bag member 13 is released, the structural body 21 and the positioning plate 11 are taken out of the bag member 13, the assembly of the positioning plate 11 is released, and the structural body 21 is taken out of the positioning plate 11. Then, the structural body 21, that is, the semiconductor element 1, the joining member 2, and the insulating substrate 3 are subjected to various processes such as a wire bonding process and a sealing process, so that the semiconductor device illustrated in FIG. 1 is completed.

<Summary of First Preferred Embodiment>

Typically, when an organic solvent is volatilized and removed from a joining member applied to an insulating substrate 3, generation of voids in the joining member can be suppressed. However, the adhesiveness of the surface of the joining member is reduced, so that a positional deviation between a semiconductor element 1 and the insulating substrate 3 is likely to occur. In contrast, according to the first preferred embodiment, the depressurization process (i.e., the exhaust process) of the bag member 13 and the pressurization process in the chamber 14a are performed with the positional relationship between the semiconductor element 1 and the insulating substrate 3 maintained by the positioning plate 11. This configuration is capable of suppressing the positional deviation between the semiconductor element 1 and the insulating substrate 3, and is therefore capable of aligning the semiconductor element 1 with the insulating substrate 3, with improved accuracy. As a result, the quality of the semiconductor device can be improved, and the cost of the semiconductor device can be reduced.

Also in the first preferred embodiment, the piston 14c isotropically pressurizes the semiconductor element 1, joining member 2, and insulating substrate 3 exposed from the positioning plate 11, via the medium 16 and the bag member 13. This configuration is capable of forming the joining member 2 having voids reduced in diameter and having uniform coarse density. As a result, the heat dissipation and electric resistance of the semiconductor device can be made uniform, so that the joining lifetime of the semiconductor device can be extended. This configuration also eliminates the need to provide a protection member on the upper surface of the semiconductor element 1, and therefore enables a reduction in cost for manufacturing the semiconductor device.

Although not illustrated, not only the semiconductor element 1 but also other electronic components may be mounted on the joining member 2, and the other electronic components and the insulating substrate 3 may be positioned by the positioning plate 11 in a manner similar to that for the semiconductor element 1. With this configuration, the other electronic components are also capable of producing advantageous effects similar to those of the semiconductor element 1. The same applies to other embodiments.

<Modifications>

In the first preferred embodiment, the medium 16 is silicone oil, fluorine-based active liquid, or the like; however, the present disclosure is not limited thereto. For example, the medium 16 may be inert gas such as argon or nitrogen. This configuration eliminates the need to provide, in the chamber 14a, a mechanism for discharging the liquid medium 16, and therefore enables a reduction in cost of the molding press machine 14. This configuration is also capable of preventing entry of the liquid medium 16 into the bag member 13, and is therefore capable of improving the quality of the semiconductor device.

Second Preferred Embodiment

Figure 4:
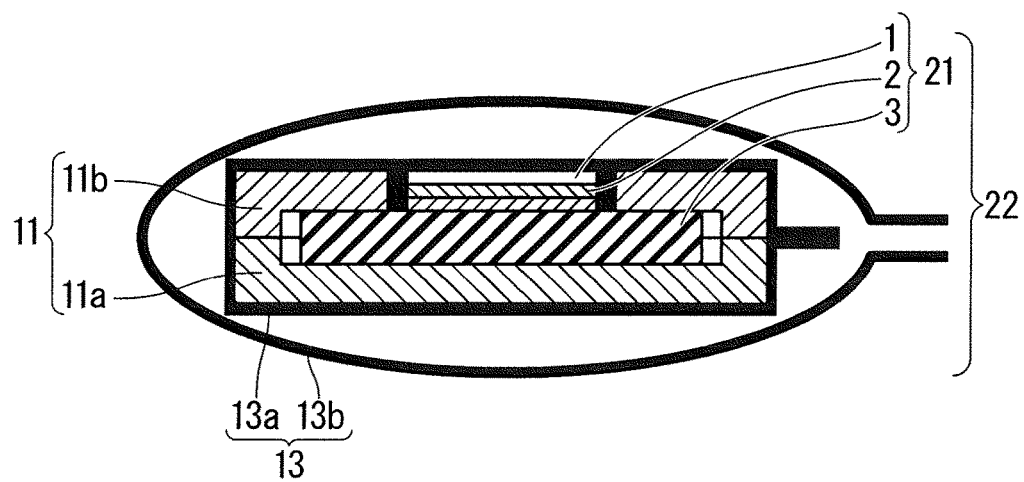
FIG. 4 is a sectional view illustrating a process of manufacturing a semiconductor device according to a second preferred embodiment.

FIG. 4 is a sectional view illustrating a process of manufacturing a semiconductor device according to a second preferred embodiment.

In the second preferred embodiment, steps similar to steps (1) to (4) described in the first preferred embodiment with reference to FIG. 2 are carried out. A structural body 21 and a positioning plate 11 are thus hermetically covered with a resin bag 13a as illustrated in FIG. 4. As illustrated in FIG. 4, next, the structural body 21, the positioning plate 11, and the resin bag 13a are placed in another resin bag 13b, and the resin bag 13a is hermetically covered with the resin bag 13b.

That is, in the second preferred embodiment, a bag member 13 is the two nested resin bags 13a and 13b. A material for each of the two resin bags 13a and 13b is, for example, polytetrafluoroethylene (PTFE) with heat resistance of 200° C. or more and ductility, or the like. It should be noted that the bag member 13 may be three or more nested resin bags.

<Summary of Second Preferred Embodiment>

According to the second preferred embodiment described above, the bag member 13 is a plurality of nested resin bags. This configuration is capable of further suppressing entry of a medium 16 into the bag member 13 in a case where a semi-finished product 22 is surrounded by the medium 16 as illustrated in FIG. 3, and is therefore capable of improving the quality of the semiconductor device.

Third Preferred Embodiment

FIG. 5 is a sectional view illustrating a process of manufacturing a semiconductor device according to a third preferred embodiment. Specifically, steps illustrated in FIG. 5 respectively correspond to steps (3) and (4) described in the first preferred embodiment with reference to FIG. 2.

As illustrated in FIG. 5, in the third preferred embodiment, a bag member 13 includes two or more metal foils 13c bonded together. That is, the bag member 13 does not necessarily have a bag shape from the beginning. A material with good thermal conductivity and electrical conductivity is used for the metal foils 13c. In bonding the metal foils 13c together, for example, a heat-resistant adhesive member 13d such as a silicone adhesive, an epoxy adhesive, or a polyimide adhesive may be used, or welding, high-temperature brazing, ultrasonic joining, or the like may be used.

<Summary of Third Preferred Embodiment>

According to the third preferred embodiment described above, the bag member 13 includes the two or more metal foils 13c bonded together. This configuration is capable of stably heating and cooling a semi-finished product 22 during, before, and after a process performed using the molding press machine 14 illustrated in FIG. 3, and is therefore capable of improving the quality of a joining member 2 subjected to heat treatment. This configuration is also capable of suppressing electrostatic destruction of a gate oxide film and the like of a semiconductor element 1, which may occur when a resin bag is used as the bag member 13, and is therefore capable of reducing a cost of the semiconductor device.

Fourth Preferred Embodiment

Figure 6:
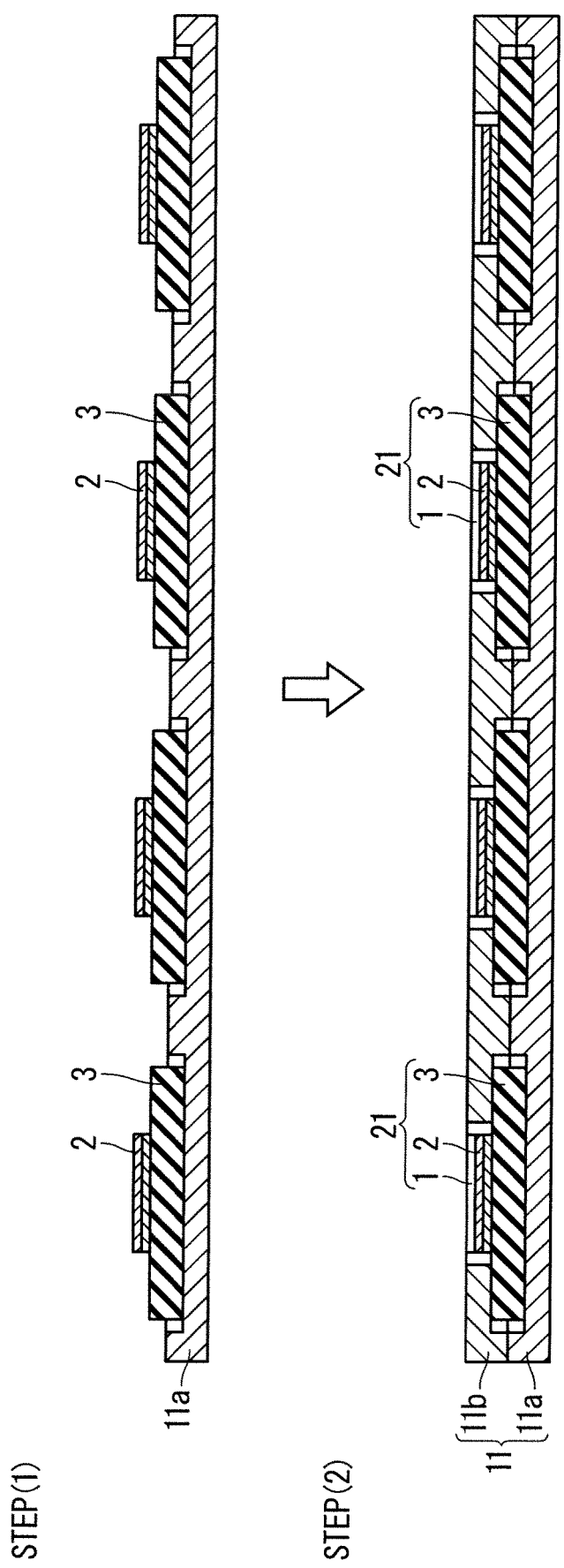
FIG. 6 is a sectional view illustrating a process of manufacturing a semiconductor device according to a fourth preferred embodiment.

FIG. 6 is a sectional view illustrating a process of manufacturing a semiconductor device according to a fourth preferred embodiment. Specifically, steps illustrated in FIG. 6 respectively correspond to steps (1) and (2) described in the first preferred embodiment with reference to FIG. 2.

As illustrated in FIG. 6, a positioning plate 11 is configured to collectively maintain positional relationships between semiconductor elements 1 and insulating substrates 3 of a plurality of structural bodies 21. That is, a first positioning plate 11a has a plurality of recesses, and a second positioning plate 11b has a plurality of recesses and a plurality of through holes. A manufacturing method according to the fourth preferred embodiment is similar to the manufacturing method according to the first preferred embodiment except that the plurality of structural bodies 21 are incorporated into the positioning plate 11.

<Summary of Fourth Preferred Embodiment>

According to the fourth preferred embodiment described above, the positioning plate 11 collectively maintains the positional relationships between the semiconductor elements 1 and the insulating substrates 3 of the plurality of structural bodies 21. This configuration is capable of applying the manufacturing method described in the first preferred embodiment to the plurality of structural bodies 21, and is therefore capable of enhancing productivity.

Fifth Preferred Embodiment

Figure 7:
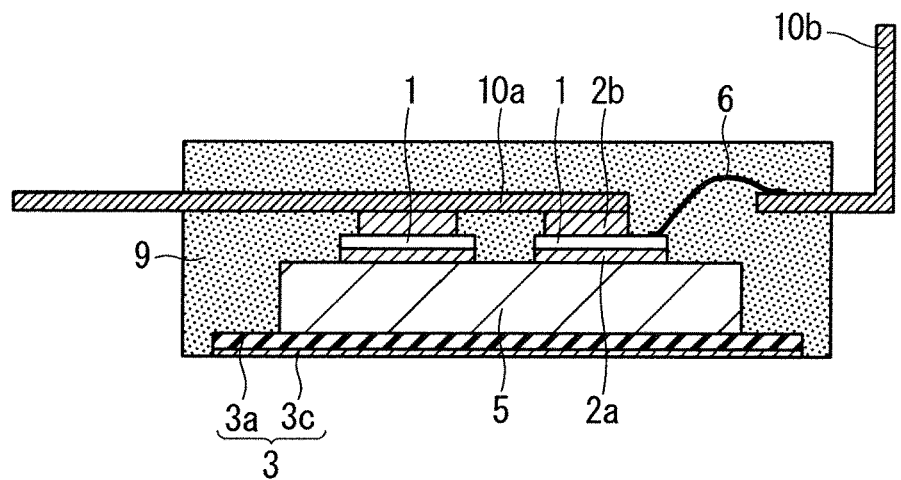
FIG. 7 is a sectional view illustrating a configuration of a semiconductor device according to a fifth preferred embodiment.

FIG. 7 is a sectional view illustrating a configuration of a semiconductor device according to a fifth preferred embodiment. The semiconductor device illustrated in FIG. 7 includes a semiconductor element 1, joining members 2a and 2b, an insulating substrate 3, a heat dissipating plate 5, a metal wire 6, a sealing member 9, and electrodes 10a and 10b.

The insulating substrate 3 includes an insulating portion 3a and a metal film 3c provided on an upper surface of the insulating portion 3a. A material for the insulating portion 3a may be, for example, an organic material such as an epoxy resin, a polyimide resin, an acrylic resin, or a polyphenylene sulfide (PPS) resin, or may be, for example, an inorganic ceramic material such as aluminum oxide ($Al_2O_3$), aluminum nitride (AlN), or silicon nitride ($Si_3N_4$). A material for the metal film 3c is, for example, copper, aluminum, an alloy thereof, or the like.

The heat dissipating plate 5 is mounted on the insulating substrate 3. A material for the heat dissipating plate 5 is similar to the material for the heat dissipating plate 5 according to the first preferred embodiment.

The semiconductor element 1 is mounted on the heat dissipating plate 5 with the joining member 2a interposed between the semiconductor element 1 and the heat dissipating plate 5. A material for the semiconductor element 1 is similar to the material for the semiconductor element 1 according to the first preferred embodiment.

The joining member 2a joins the semiconductor element 1 and the heat dissipating plate 5 together. A material for the joining member 2a is similar to the material for the joining member 2 according to the first preferred embodiment.

The electrode 10a is mounted on the semiconductor element 1 with the joining member 2b interposed between the electrode 10a and the semiconductor element 1. The electrode 10b is connected to the semiconductor element 1 via the metal wire 6. A material for the electrode 10a and the electrode 10b is similar to the material for the electrode 10 according to the first preferred embodiment. A material for the joining member 2b is similar to the material for the joining member 2 according to the first preferred embodiment. A material for the metal wire 6 is similar to the material for the metal wire 6 according to the first preferred embodiment.

The sealing member 9 seals an aggregate of the foregoing components, as a body to be sealed. A material for the sealing member 9 is, for example, an insulating resin such as an epoxy resin. Although not illustrated, a control board connected by wiring to the semiconductor element 1 may be provided in the sealing member 9.

<Manufacturing Method>

Figure 8:
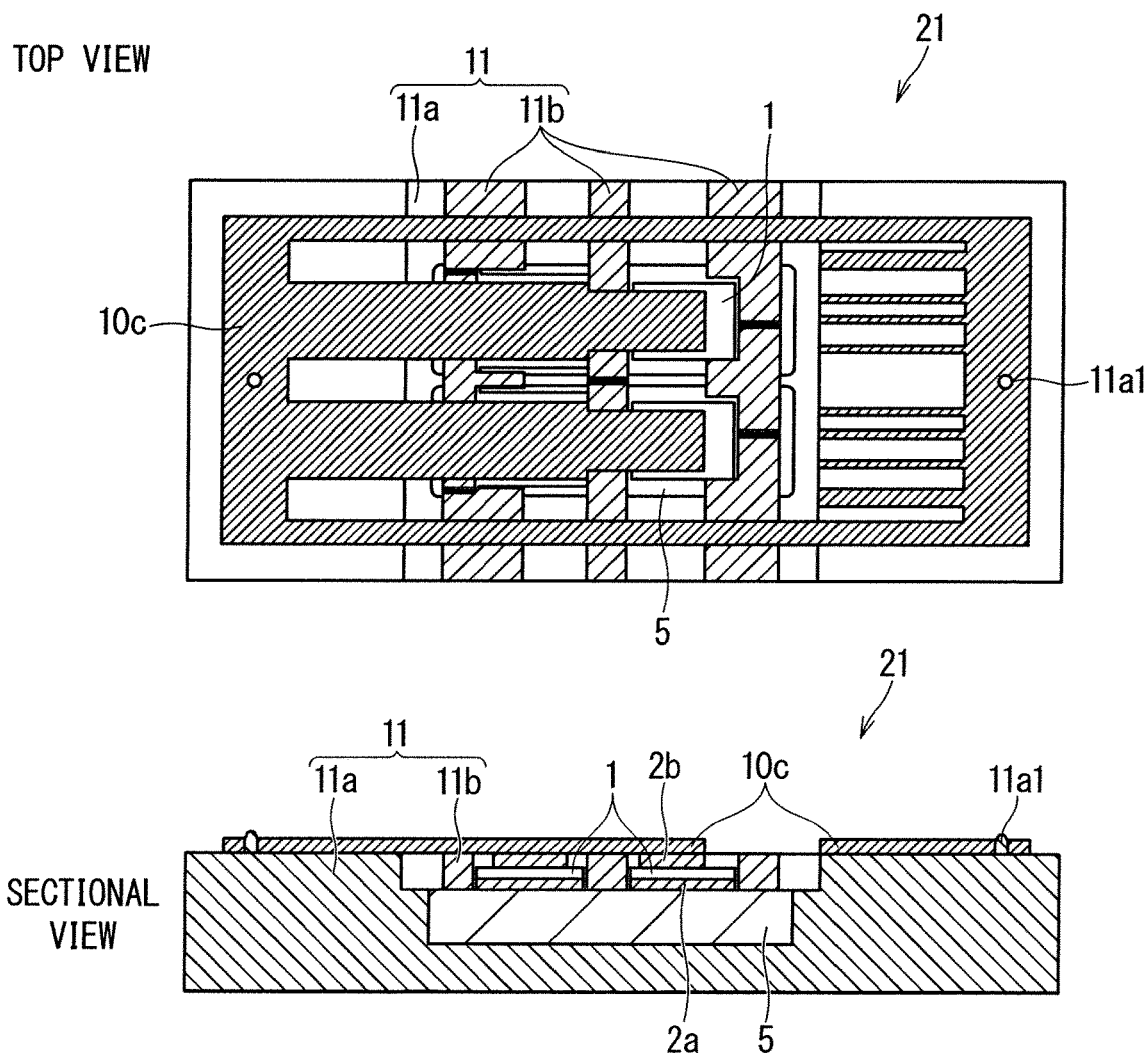
FIG. 8 is a top view and a sectional view illustrating a process of manufacturing the semiconductor device according to the fifth preferred embodiment.
Figure 9:
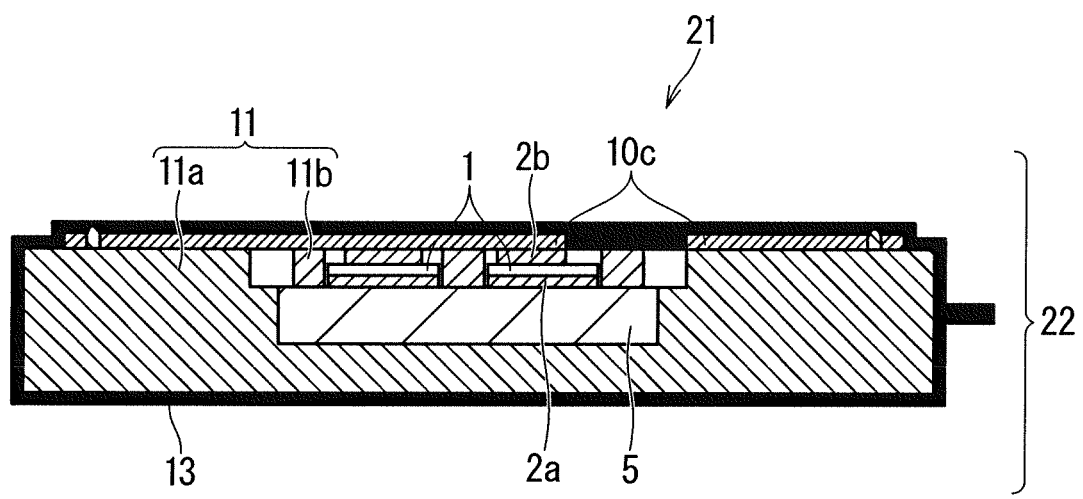
FIGS. 9 and 10 are sectional views each illustrating a process of manufacturing the semiconductor device according to the fifth preferred embodiment.

FIG. 8 is a top view and a sectional view illustrating a process of manufacturing the semiconductor device according to the fifth preferred embodiment. FIG. 9 is a sectional view illustrating a process of manufacturing the semiconductor device according to the fifth preferred embodiment. Specifically, steps illustrated in FIG. 8 respectively corresponds to steps (1) and (2) described in the first preferred embodiment with reference to FIG. 2, and a step illustrated in FIG. 9 corresponds to step (4) described in the first embodiment with reference to FIG. 2.

In step (1), as in step (1) described in the first preferred embodiment, a joining member containing an organic solvent and metal powder such as silver or copper is applied to an upper surface of a heat dissipating plate 5 by a dispensing method or a print masking method, and the organic solvent is volatilized and removed, so that a joining member 2a containing the metal powder is formed. Then, a semiconductor element 1 is mounted on the joining member 2a. Moreover, a joining member containing an organic solvent and metal powder such as silver or copper is applied to an upper surface of the semiconductor element 1 by a dispensing method or a print masking method, and the organic solvent is volatilized and removed, so that a joining member 2b containing the metal powder is formed.

In step (2), next, as illustrated in FIG. 8, the heat dissipating plate 5 is fitted into a recess of a first positioning plate 11a. The recess of the first positioning plate 11a is slightly larger than an outer shape of the heat dissipating plate 5. Next, a second positioning plate 11b having a through hole slightly larger than an outer shape of the semiconductor element 1 is placed. Next, a metal plate 10c serving as electrodes 10a and 10b is mounted on the first positioning plate 11a and the joining member 2b. A pin 11a1 provided on the first positioning plate 11a is fitted into a hole formed in the metal plate 10c.

The second positioning plate 11b may be divided into a plurality of parts as illustrated in the top view of FIG. 8. This configuration is capable of facilitating attachment and detachment of the second positioning plate 11b to and from a portion below the metal plate 10c.

The first positioning plate 11a and the second positioning plate 11b described above are capable of maintaining a positional relationship among the semiconductor element 1, the heat dissipating plate 5, and the metal plate 10c. Hereinafter, the assembled structure of the first positioning plate 11a and the second positioning plate 11b may be referred to as a positioning plate 11.

In step (2) described above, a structural body 21 in which the joining member 2a is provided between the semiconductor element 1 and the heat dissipating plate 5 is partially surrounded by the positioning plate 11, and the semiconductor element 1, the joining member 2a, and the heat dissipating plate 5 around the joining member 2a are exposed from the positioning plate 11. The positional relationship between the semiconductor element 1 and the heat dissipating plate 5 is thus maintained. It should be noted that a material for the positioning plate 11 is similar to the material for the positioning plate 11 according to the first embodiment.

In step (3), next, as in step (3) described in the first preferred embodiment, the structural body 21 and the positioning plate 11 are placed in a bag member 13 with the positional relationship between the semiconductor element 1 and the heat dissipating plate 5 maintained.

In step (4), next, as illustrated in FIG. 9, as in step (4) described in the first preferred embodiment, the bag member 13 is sealed with an inside of the bag member 13 degassed and depressurized, so that a semi-finished product 22 is formed.

Thereafter, using the molding press machine 14 illustrated in FIG. 3, as in the first preferred embodiment, the heater 14d heats the joining member 2a while the piston 14c isotropically pressurizes the heat dissipating plate 5, joining member 2a, and semiconductor element 1 exposed from the positioning plate 11, via a medium 16 and the bag member 13. This configuration is capable of sintering the joining member 2a having voids reduced in diameter and having uniform coarse density, and is therefore capable of joining by sintering the semiconductor element 1 and the heat dissipating plate 5 together, with high quality at low cost.

In the fifth preferred embodiment, not only the joining member 2a but also the joining member 2b is positioned, pressurized, and heated in a manner similar to that for the joining member 2a. This configuration is capable of sintering the joining member 2b having voids reduced in diameter and having uniform coarse density, and is therefore capable of joining by sintering the semiconductor element 1 and the metal plate 10c together, with high quality at low cost.

After completion of the joining, the semi-finished product 22 is taken out of the chamber 14a, the sealing of the bag member 13 is released, the structural body 21 and the positioning plate 11 are taken out of the bag member 13, the assembly of the positioning plate 11 is released, and the structural body 21 is taken out of the positioning plate 11. Then, the structural body 21, that is, the semiconductor element 1, the joining member 2a and 2b, and the heat dissipating plate 5 are subjected to a wire bonding process and a sealing process.

Figure 10:
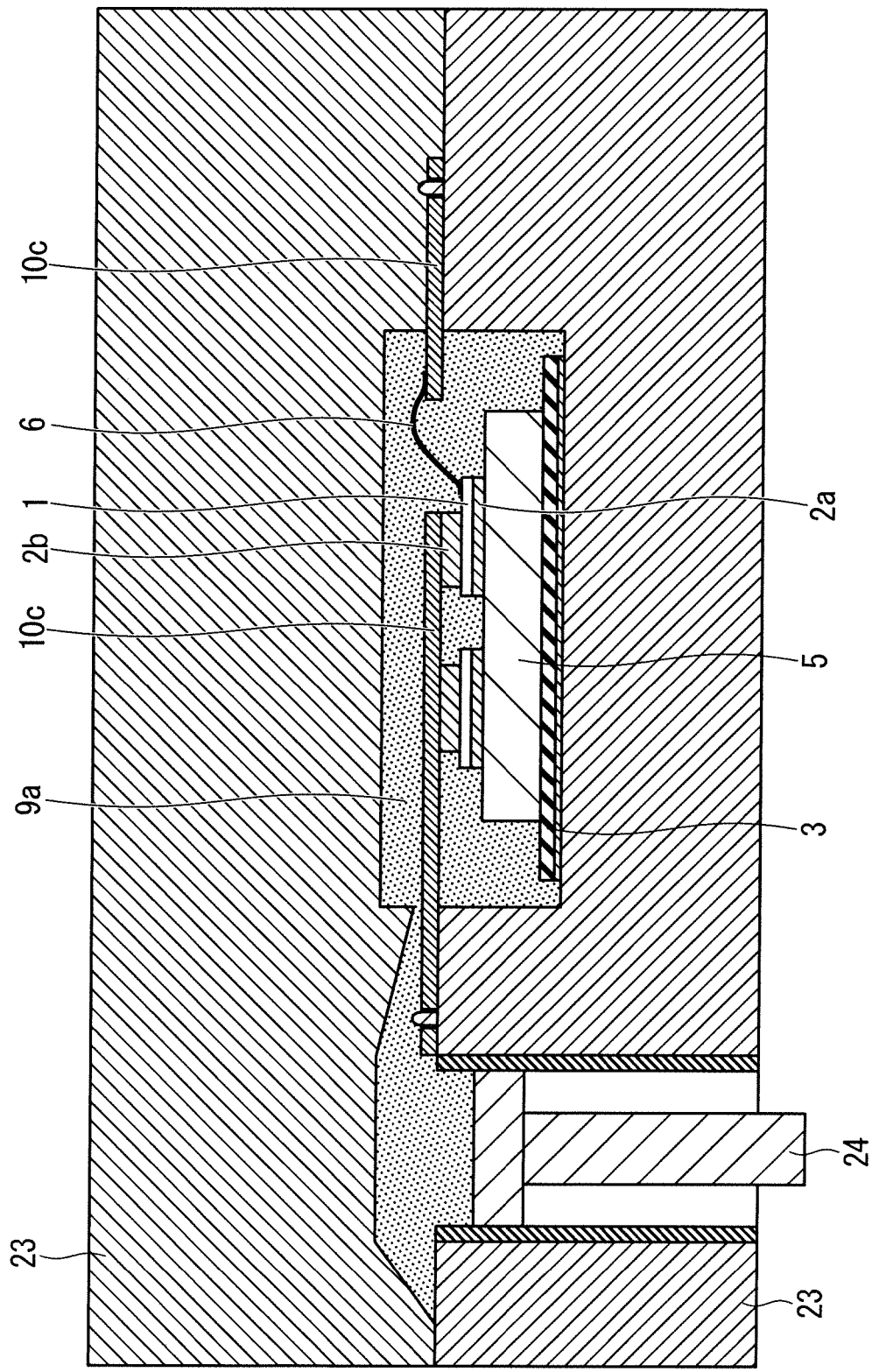

FIG. 10 is a sectional view illustrating a sealing process which is a process of manufacturing the semiconductor device according to the fifth preferred embodiment. As illustrated in FIG. 10, after the heat dissipating plate 5 to which the semiconductor element 1 is joined and the insulating substrate 3 are placed in a space in a molding die 23, a heat-resistant insulating resin 9a before curing is poured into the space by a piston 24. Next, the heat-resistant insulating resin 9a is cured, with the semiconductor element 1 and the like sealed, so that a sealing member 9 is formed. Next, various processes such as a cutting process for forming electrodes 10a and 10b from the metal plate 10c are performed, so that the semiconductor device illustrated in FIG. 7 is completed.

<Summary of Fifth Preferred Embodiment>

According to the fifth preferred embodiment described above, a decompression process (i.e., an exhaust process) of the bag member 13 and the pressurization process in the chamber 14a are performed with the positional relationship between the semiconductor element 1 and the heat dissipating plate 5 maintained by the positioning plate 11. This configuration is capable of suppressing the positional deviation between the semiconductor element 1 and the heat dissipating plate 5, and is therefore capable of aligning the semiconductor element 1 with the heat dissipating plate 5, with improved accuracy. As a result, the quality of the semiconductor device can be improved, and the cost of the semiconductor device can be reduced.

According to the fifth preferred embodiment, the piston 14c isotropically pressurizes the semiconductor element 1, joining member 2a, and heat dissipating plate 5 exposed from the positioning plate 11, via the medium 16 and the bag member 13. This configuration is capable of forming the joining member 2a having voids reduced in diameter and having uniform coarse density. As a result, the heat dissipation and electric resistance of the semiconductor device can be made uniform, so that the joining lifetime of the semiconductor device can be extended. This configuration also eliminates the need to provide a protection member on the upper surface of the semiconductor element 1, and therefore enables a reduction in cost for manufacturing the semiconductor device.

According to the fifth preferred embodiment, not only the joining member 2a but also the joining member 2b is positioned, pressurized, and heated in a manner similar to that for the joining member 2a. This configuration is capable of performing the processing for the joining member 2b in parallel with the processing for the joining member 2a, and is therefore capable of reducing the cost for manufacturing the semiconductor device.

It should be noted that each of the preferred embodiments and each of the modifications can be freely combined, and each of the preferred embodiments and each of the modifications can be appropriately modified or omitted.

Hereinafter, various aspects of the present disclosure will be collectively described as supplementary notes.

(Supplementary Note 1)

A semiconductor device manufacturing method including:
  partially surrounding, with a positioning plate, a structural body in which a joining member containing metal powder is provided between a semiconductor element and a base plate, and exposing the semiconductor element, the joining member, and the base plate around the joining member from the positioning plate to maintain a positional relationship between the semiconductor element and the base plate;
  placing the structural body and the positioning plate in a bag member with the positional relationship maintained;
  sealing the bag member with an inside of the bag member depressurized to form a semi-finished product;
  housing, in a chamber, the semi-finished product and a medium surrounding the semi-finished product; and
  heating the joining member with a heater while isotropically pressurizing the semiconductor element, joining member, and base plate exposed from the positioning plate, with a piston via the medium and the bag member.

(Supplementary Note 2)

The semiconductor device manufacturing method according to supplementary note 1, wherein the bag member is a single resin bag or a plurality of nested resin bags.

(Supplementary Note 3)

The semiconductor device manufacturing method according to supplementary note 1, wherein the bag member includes two or more metal foils bonded together.

(Supplementary Note 4)

The semiconductor device manufacturing method according to any one of supplementary notes 1 to 3, wherein the positioning plate collectively maintains the positional relationships between the semiconductor elements and the base plates of a plurality of the structural bodies.

(Supplementary Note 5)

The semiconductor device manufacturing method according to any one of supplementary notes 1 to 4, wherein the base plate is at least any one of an insulating substrate, a heat dissipating plate, and a metal plate.

(Supplementary Note 6)

The semiconductor device manufacturing method according to any one of supplementary notes 1 to 5, wherein a material for the positioning plate includes at least any one of metal, resin, and carbon.

(Supplementary Note 7)

The semiconductor device manufacturing method according to any one of supplementary notes 1 to 6, wherein the medium is silicone oil or inert gas.

(Supplementary Note 8)

A molding press machine for pressurizing a pressurization-target product,
  the pressurization-target product formed by:
  partially surrounding, with a positioning plate, a structural body in which a joining member containing metal powder is provided between a semiconductor element and a base plate, and exposing the semiconductor element, the joining member, and the base plate around the joining member from the positioning plate to maintain a positional relationship between the semiconductor element and the base plate;
  placing the structural body and the positioning plate in a bag member with the positional relationship maintained; and
  sealing the bag member with an inside of the bag member depressurized,
  the molding press machine including:
  a chamber that houses the pressurization-target product and a medium surrounding the pressurization-target product;
  a piston that isotropically pressurizes the semiconductor element, joining member, and base plate exposed from the positioning plate, via the medium and the bag member; and
  a heater that heats the joining member during isotropic pressurization by the piston.

While the disclosure has been shown and described in detail, the foregoing description is in all aspects illustrative and not restrictive. It is therefore understood that numerous modifications and variations can be devised.

What is claimed is:

1. A semiconductor device manufacturing method comprising:
    partially surrounding, with a positioning plate, a structural body in which a joining member containing metal powder is provided between a semiconductor element and a base plate, such that a portion of the semiconductor element, a portion of the joining member, and a portion of the base plate around the joining member are exposed from the positioning plate to the outside of the positioning plate while maintaining a positional relationship between the semiconductor element and the base plate;
    placing the structural body and the positioning plate in a bag member with the positional relationship maintained;
    sealing the bag member with an inside of the bag member depressurized to form a semi-finished product;
    housing, in a chamber, the semi-finished product and a medium surrounding the semi-finished product; and
    heating the joining member with a heater while isotropically pressurizing the semiconductor element, joining member, and base plate partially exposed from the positioning plate, with a piston via the medium and the bag member.

2. The semiconductor device manufacturing method according to claim 1, wherein
    the bag member is a single resin bag or a plurality of nested resin bags.

3. The semiconductor device manufacturing method according to claim 1, wherein
    the bag member includes two or more metal foils bonded together.

4. The semiconductor device manufacturing method according to claim 1, wherein
    the positioning plate collectively maintains the positional relationships between the semiconductor elements and the base plates of a plurality of the structural bodies.

5. The semiconductor device manufacturing method according to claim 1, wherein
    the base plate is at least any one of an insulating substrate, a heat dissipating plate, and a metal plate.

6. The semiconductor device manufacturing method according to claim 1, wherein
    a material for the positioning plate includes at least any one of metal, resin, and carbon.

7. The semiconductor device manufacturing method according to claim 1, wherein
    the medium is silicone oil or inert gas.

8. A semiconductor device manufacturing method comprising:
    partially surrounding, with a positioning plate, a structural body in which a joining member containing metal powder is provided between a semiconductor element and a base plate;
    placing the structural body and the positioning plate in a bag member while maintaining a positional relationship between the semiconductor element and the base plate;
    sealing the bag member with an inside of the bag member depressurized to form a semi-finished product;
    housing, in a chamber, the semi-finished product and a medium surrounding the semi-finished product; and
    heating the joining member with a heater while isotropically pressurizing the semiconductor element, joining member, and base plate partially exposed from the positioning plate, with a piston via the medium and the bag member.

* * * * *